US011077761B2

(12) United States Patent
Takeda

(10) Patent No.: US 11,077,761 B2
(45) Date of Patent: Aug. 3, 2021

(54) POWER SUPPLY SYSTEM FOR VEHICLE

(71) Applicant: HONDA MOTOR CO., LTD., Tokyo (JP)

(72) Inventor: Mitsuhiro Takeda, Wako (JP)

(73) Assignee: HONDA MOTOR CO., LTD., Tokyo (JP)

(*) Notice: Subject to any disclaimer, the term of this patent is extended or adjusted under 35 U.S.C. 154(b) by 215 days.

(21) Appl. No.: 16/419,003

(22) Filed: May 22, 2019

(65) Prior Publication Data
US 2019/0359072 A1 Nov. 28, 2019

(30) Foreign Application Priority Data

May 25, 2018 (JP) .............................. JP2018-100760

(51) Int. Cl.
B60L 53/10 (2019.01)
B60L 53/22 (2019.01)
(Continued)

(52) U.S. Cl.
CPC ............... B60L 53/11 (2019.02); B60L 50/51 (2019.02); B60L 53/22 (2019.02);
(Continued)

(58) Field of Classification Search
CPC .......... B60L 50/51; B60L 50/60; B60L 53/11; B60L 53/22; B60L 58/10; B60L 58/20; B60L 58/25; B60L 1/00; B60L 3/0023; B60L 3/0046; B60L 2210/12; B60L 2210/42; B60L 2210/40; B60L 2270/20; B60L 2220/42; B60L 15/007; G01R 31/3842; Y02T 90/14; Y02T 10/70; Y02T 10/72; Y02T 10/7072; Y02T 10/64
(Continued)

(56) References Cited

U.S. PATENT DOCUMENTS

2009/0171554 A1* 7/2009 Yaguchi ................. B60L 58/25
701/112
2010/0070133 A1* 3/2010 Ishishita ................ B60L 58/20
701/36
2015/0061613 A1 3/2015 Kondou

FOREIGN PATENT DOCUMENTS

JP 04-183206 6/1992
JP 2005-033899 2/2005
(Continued)

OTHER PUBLICATIONS

Japanese Office Action for corresponding JP Application No. 2018-100760, dated Jan. 8, 2020.

Primary Examiner — Paul Dinh
(74) Attorney, Agent, or Firm — Mori & Ward, LLP

(57) ABSTRACT

To provide a power supply system for a vehicle which can appropriate charge a capacitor on a step-down side, and suppress system failure. The power supply system for a vehicle includes: a high-voltage battery; a first inverter which connects with the high-voltage battery; a drive motor which connects with the first inverter; a high-voltage DCDC converter which steps down the voltage of the high-voltage battery; an accessory, etc. which connects with the high-voltage DCDC converter; a capacitor which connects in parallel with the accessory, etc.; a current sensor, etc. which acquires the charging state of the capacitor; and a VCUECU which controls the high-voltage DCDC converter based on the acquired values of the current sensor, etc.

11 Claims, 6 Drawing Sheets

(51) Int. Cl.
*B60L 50/51* (2019.01)
*G01R 31/3842* (2019.01)

(52) U.S. Cl.
CPC ...... *G01R 31/3842* (2019.01); *B60L 2210/12* (2013.01); *B60L 2210/42* (2013.01)

(58) Field of Classification Search
USPC .......................... 701/36; 320/132, 140, 149
See application file for complete search history.

(56) References Cited

FOREIGN PATENT DOCUMENTS

| | | |
|---|---|---|
| JP | 2006-158073 | 6/2006 |
| JP | 2010-259188 | 11/2010 |
| JP | 2013-017330 | 1/2013 |
| JP | 2015-047017 | 3/2015 |
| JP | 2015-216725 | 12/2015 |
| JP | 2015-216776 | 12/2015 |

* cited by examiner

POWER SUPPLY SYSTEM FOR VEHICLE

This application is based on and claims the benefit of priority from Japanese Patent Application No. 2018-100760, filed on 25 May 2018, the content of which is incorporated herein by reference.

BACKGROUND OF THE INVENTION

Field of the Invention

The present invention relates to the power supply system for a vehicle.

Related Art

Conventionally, a power supply system for a vehicle has been known which performs electric power supply to a plurality of drive motors via a single voltage converter from a battery. The voltage of the battery is converted to a fixed voltage by the voltage converter, and each drive motor is driven by the converted voltage (Patent Document 1).

Patent Document 1: Japanese Unexamined Patent Application, Publication No. 2015-216725

SUMMARY OF THE INVENTION

However, with the configuration of Patent Document 1, since the plurality of motors are connected in parallel to the opposite side of the battery relative to the single voltage converter, the voltages supplied to each motor are equal potentials. There has thereby been a problem in that the selections of combinations of motors are limited such as not being able to combine and use motors of different ratings.

Therefore, by providing a voltage converter between the plurality of motors, a configuration giving a different voltage to each motor has been proposed; however, according to the connection position of the storage battery relative to the voltage converter, there have been problems in that a circuit in which pre-charge is not carried out during connection of the storage battery is produced, and this circuit (fuse, accessory, etc.) may breakdown by a sudden voltage change during drive start of the voltage converter. In other words, in the system including a plurality of motors which drive with different voltages, margin for improvement remains in the circuit voltage control during drive start.

The present invention has an object of providing an electric power system of a vehicle, which can appropriately charge a capacitor on a step-down side, and suppress system failure.

A power supply system (for example, the power supply system 1) for a vehicle according to a first aspect of the present invention is characterized by including: a storage battery (for example, the high-voltage battery 21 described later); a first power converter (for example, the first inverter 23 described later) which connects with the storage battery; a first drive motor (for example, the drive motor RM described later) which connects with the first power converter; a voltage converter (for example, the high-voltage DCDC converter 22 described later) which steps down voltage of the storage battery; an electrical machine (for example, the second inverter 24, accessory 6, etc. described later) which connects with the voltage converter; a capacitor (for example, the capacitor C1 described later) which connects in parallel with the electrical machine; a charging state acquisition means (for example, the current sensor 30, voltage sensor 28 described later) for acquiring a charging state of the capacitor; and a control means (for example, the VCUECU 8 described later) for controlling the voltage converter based on an acquired value of the charging state acquisition means.

According to the power supply system for a vehicle as described in the first aspect, since it is possible to appropriately charge a capacitor on a step-down side, system failure can be suppressed.

According to a second aspect of the present invention, the power supply system for a vehicle as described in the first aspect may further include: a switching means (for example, the contactor 212p described later) for switching between a connected state and isolated state of the storage battery, in which the control means may control the voltage converter based on the acquired value of the charging state acquisition means when the switching means switched from the isolated state to the connected state.

According to the power supply system for a vehicle as described in the second aspect, it is possible to appropriately perform charging of a capacitor on the step-down side after system startup, and possible to quickly establish the electrical machine in a standby state.

According to a third aspect of the present invention, in the power supply system for a vehicle as described in the first or second aspect, the charging state acquisition means may be a current value acquisition means (for example, the current sensor 30 described later), and control the voltage converter so that a charging current value to the capacitor becomes constant.

According to the power supply system for a vehicle as described in the third aspect, it is possible to reliably perform charging with a desired charging time, and possible to suppress blowing of a fuse.

According to a fourth aspect of the present invention, in the power supply system for a vehicle as described in the first or second aspect, the charging state acquisition means may be a voltage value acquisition means (for example, the voltage sensor 28 described later), and control the voltage converter so that the charging voltage value of the capacitor rises step-wise.

According to the power supply system for a vehicle as described in the fourth aspect, it is possible to appropriately perform charging until a predetermined charged voltage, and blowing of a fuse can be suppressed.

According to a fifth aspect of the present invention, in the power supply system for a vehicle as described in any one of the first to fourth aspects, the electrical machine may be a secondary drive motor which connects via a second power converter.

According to the power supply system for a vehicle as described in the fifth aspect, it is possible to realize a system including a plurality of motors of different drive voltages relative to one battery.

According to a sixth aspect of the present invention, in the power supply system for a vehicle as described in any one of the first to fifth aspects, the electrical machine may be an accessory.

According to the power supply system for a vehicle as described in the sixth aspect, it is possible to avoid unnecessary cost increase such as for handling of high voltage of accessories, and possible to suppress failure of accessories.

According to a seventh aspect of the present invention, in the power supply system for a vehicle as described in the sixth aspect, the accessory may be: a DC charging unit (for example, the DC charging unit 4 described later) capable of charging by the DC charging source; an applied voltage value acquisition means (for example, the voltage sensor 49 described later) for acquiring a voltage value applied to the DC charging unit by an external charging device; a high-voltage charging path (for example, charging to battery without passing through VCU) which connects from the DC charging unit to between the voltage converter and the storage battery; and a low-voltage charging path (for example, charging to battery by passing through VCU) which connects from a DC charging unit between a voltage converter and the second power converter, in which the control means may control the voltage converter based on an applied voltage acquired value prior to charging start from the low-voltage charging path, and regulate voltage of a capacitor.

According to the power supply system for a vehicle as described in the seventh aspect, since it is possible to appropriate charge to a capacitor on a step-down side, system failure can be suppressed.

According to a eighth aspect of the present invention, the power supply system for a vehicle as described in any one of the first to seventh aspects may further include a switching element disposed between a coil of a voltage converter which steps down the voltage of the storage battery, and an electrical machine (for example, the second inverter 24 and accessory 6 described later) which connects with the voltage converter.

According to the power supply system for a vehicle as described in the eighth aspect, upon the element of the top-side arm of the voltage converter short-circuit failing, it is possible to suppress the high voltage for being applied to the electrical machine side.

According to the present invention, it is possible to provide an electric power system of a vehicle, which can appropriately charge a capacitor on a step-down side, and suppress system failure.

DETAILED DESCRIPTION OF THE INVENTION

Figure 1:
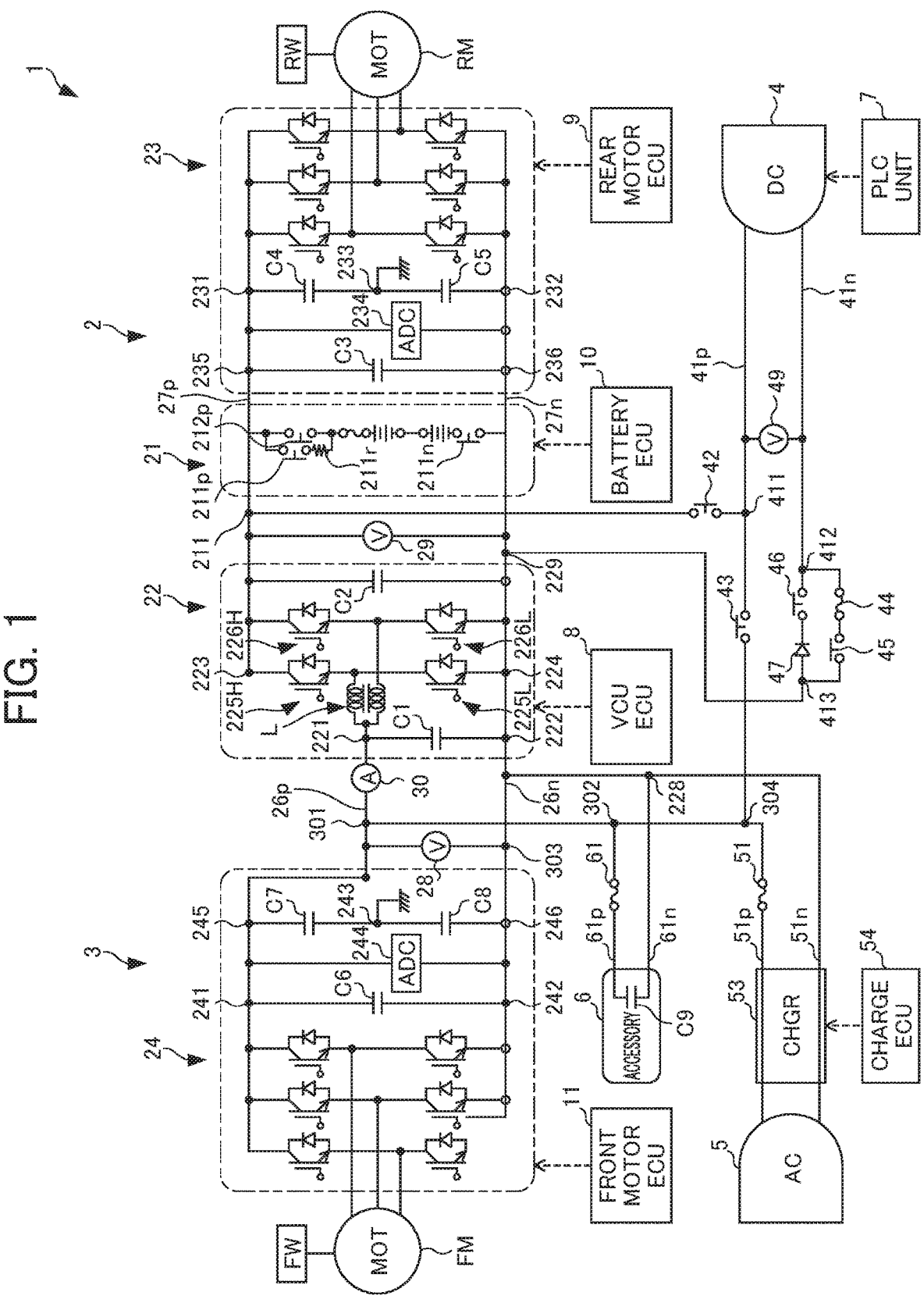
FIG. 1 is a view showing an power supply system for a vehicle according to a first embodiment of the present invention.

Hereinafter, an embodiment of the present invention will be explained by referencing the drawings. FIG. 1 is a view showing the configuration of an electric vehicle V (hereinafter simply referred as "vehicle") equipped with a power supply system 1 according to the present embodiment. It should be noted that, in the present embodiment, although a four-wheel drive electric automobile of including drive motors is explained as the vehicle V in the example, the present invention is not to be limited thereto. The electric power system according to the present invention is applicable to any vehicle so long as being a vehicle which travels using electricity stored in a battery such as a two-wheel drive electric automobile, hybrid vehicle or fuel-cell vehicle.

The vehicle V includes the power supply system 1, drive motor FM of front wheels FW, and drive motor RM of rear wheels RW. The drive motors FM and RM mainly generate motive power for the vehicle V to travel. The output shafts of the drive motors FM and RM are coupled to the drive wheels FW and RW via a power transmission system which is not illustrated. The torque generated by the drive motors FM and RM by supplying electric power to the drive motors FM and RM from the power supply system 1 is respectively transmitted to the drive wheels FW and RW via a power transmission system which is not illustrated, thereby causing the drive wheels FW and RW to rotate and cause the vehicle V to travel. In addition, the drive motors FM and RM act as generators during deceleration generation of the vehicle V. The electric power generated by the electric motors M is charged to a high-voltage battery 21 equipped to the power supply system 1.

The power supply system 1 includes a high-voltage circuit 2 provided to the high-voltage battery 21, a low-voltage circuit 3 of lower voltage than the high-voltage battery 21, the drive motor FM which drives the front wheels FW, the drive motor RM which drives the rear wheels RW, a DC charging unit 4 capable of supplying electric power to the high-voltage circuit 2 and low-voltage circuit 3, an AC charging unit 5 capable of supplying electric power to the low-voltage circuit 3, and an accessory 6 having a heater, etc.

The high-voltage circuit 2 includes the high-voltage battery 21, a high-voltage DCDC converter 22 serving as a voltage converter, first electric power lines 26p, 26n which connect both positive/negative electrodes of the high-voltage battery 21 with the low-voltage side positive terminal 221 and low-voltage side negative terminal 222 of the high-voltage DCDC converter 22, a first inverter 23 serving as a power converter, second electric power lines 27p, 27n which connect the high-voltage side positive terminal 223 and high-voltage side negative terminal 224 of the high-voltage DCDC converter 22 with the DC I/O side of the first inverter 23; and a secondary-side voltage sensor 29 which detects the voltage of the second electric power lines 27p, 27n.

The high-voltage battery 21 is a secondary battery which can be both discharged to convert chemical energy into electrical energy, and charged to convert electrical energy into chemical energy. Hereinafter, a case of using a so-called lithium-ion storage battery which carries out charge/discharge by lithium ions migrating between electrodes as this high-voltage battery 21 will be explained; however, the present invention is not to be limited thereto.

The high-voltage DCDC converter 22 is provided between the first electric power lines 26p, 26n and the second electric power lines 27p, 27n. The low-voltage side positive terminal 221 and low-voltage side negative terminal 222 of the high-voltage DCDC converter 22 are connected to the high-voltage battery 21 via the first electric power lines 26p, 26n as mentioned above, respectively. The high-voltage side positive terminal 223 and high-voltage side negative terminal 224 of the high-voltage DCDC converter 22 are connected to the high-voltage battery 21 and first inverter 23 via the second electric power lines 27p, 27n.

The high-voltage DCDC converter 22 is a two-way DCDC converter configured by combining a reactor L, a first smoothing capacitor C1, high-arm elements 225H, 226H, low-arm elements 225L, 226L, a second smoothing capacitor C2, and a negative bus bar 227.

The high-arm element 225H includes a known power switching element such as IGBT or MOSFET, and a diode connected in parallel to this power switching element. The low-arm element 225L includes a known power switching element such as IGBT or MOSFET and a diode connected in parallel to this power switching element. This high-arm elements 225H and low-arm element 225L are connected in this order in series between the high-voltage side positive terminal 223 and negative bus bar 227. The high-arm element 226H and low-arm element 226L are also connected in this order in series between the high-voltage side positive terminal 223 and negative bus bar 227.

A collector of the power switching element of the high-arm element 225H is connected to the high-voltage side positive terminal 223, and the emitter thereof is connected to the collector of the low-arm element 225L. The emitter of the power switching element of the low-arm element 225L is connected to the negative bus bar 227. The forward direction of diodes provided to the high-arm element 225H is an orientation directed from the reactor L to the high-voltage side positive terminal 223. In addition, the forward direction of diodes provided to the low-arm element 225L is an orientation directed from the negative bus bar 227 to the reactor L. One terminal of the reactor L is connected between the emitter of the high-arm element 225H and the collector of the low-arm element 225L, and another terminal of the reactor L is connected between the high-arm element 226H and the collector of the low-arm element 226L.

These high-arm element 225H, 226H and low-arm elements 225L, 226L are turned ON or OFF by gate drive signals generated by a VCUECU 8, respectively.

The high-voltage DCDC converter 22 exhibits a step-down function on the current in both directions, by driving ON/OFF the above-mentioned elements 225H, 225L in accordance with gate drive signals generated at a predetermined timing from the VCUECU 8. Step-down function refers to a function of stepping down the voltage applied to the terminals 223, 224 on the high-voltage side and outputting to the terminals 221, 222 on the low-voltage side, whereby it is also possible to flow current from the second electric power lines 27p, 27n to the first electric power lines 26p, 26n, and flow current from the first electric power lines 26p, 26n to the second electric power lines 27p, 27n. It should be noted that, hereinafter, the potential difference between the first electric power lines 26p, 26n is referred to as primary-side voltage V1. In addition, the potential difference between the second electric power lines 27p, 27n is referred to as secondary side voltage V2.

A primary-side voltage sensor 28 detects this primary-side voltage V1, the secondary-side sensor 29 detects this secondary-side voltage V2, and sends a signal according to detected values to the VCUECU 8.

The first inverter 23 is a PWM inverter by way of pulse width modulation including a bridge circuit constituted by bridge connecting a plurality of switching elements (e.g., IGBT), for example, and includes a function of converting between DC power and AC power. The first inverter 23 is connected to the terminal 231 of the second electric power line 27p and the terminal 232 of the second electric power line 27n at the DC I/O side thereof, and is connected to each coil of the U-phase, V-phase and W-phase of the drive motor RM on the AC I/O side. A grounded terminal 233 is provided between the terminal 231 and terminal 232, a capacitor C4 is provided between the terminal 231 and terminal 233, and a capacitor C5 is provided between the terminal 232 and terminal 233. An active discharge controller 234 which controls discharge during collision of the vehicle V and the capacitor C3 are provided between the second electric power lines 27p, 27n in parallel relative to the capacitors C4, C5.

The first inverter 23 is configured by bridge connecting for every phase the high-side U-phase switching element and low-side U-phase switching element connected to the U phase of the drive motor RM, the high-side V-phase switching element and low-side V-phase switching element connected to the V phase of the drive motor RM, and the high-side W-phase switching element and low-side W-phase switching element connected to the W phase of the drive motor RM.

By ON/OFF driving the switching elements of the above-mentioned respective phases in accordance with the gate drive signals generated at the predetermined timing by the motor ECU 9, the first inverter 23 converts the DC power supplied from the high-voltage DCDC converter 22 into AC power and supplies to the drive motor RM, and converts AC power supplied from the drive motor RM into DC power and supplies to the high-voltage DCDC converter 22. It should be noted that either of the output of the drive motor FM of the front wheels FW and of the drive motor RM of the rear wheels RW may be larger.

The DC charging unit 4 is controlled by a PLC unit 7, and is connected to the DC power source to perform charging of the high-voltage battery 21 electrical supply and electrical power supply to the primary side. The positive terminal of the DC charging unit 4 is connected to a third electric power line 41p, and the negative terminal of the DC charging unit 4 is connected to a third electric power line 41n. The third electric power line 41p is connected to the terminal 211 of the second electric power line 27p via the terminal 411 and contactor 42, and connected to the terminal 301 of the first electric power line 26p via the terminal 304. The third electric power line 41n is connected to the terminal 229 of the negative bus bar 227 via the terminals 412 and 413 in this order. The contactors 45, 46 are provided in parallel between the terminal 412 and terminal 413 to the third electric power line 41n, a fuse 44 for protection during short circuiting is provided in series on the terminal 412 side to the contactor 45, and a diode 47 having a forward direction which is in a direction from the terminal 413 to terminal 412 is connected in series to the contactor 46.

The high-voltage battery 21 has a positive terminal connected to the second electric power line 27p, a negative terminal connected to the second electric power line 27n, and is connected in parallel between the high-voltage DCDC converter 22 and first inverter 23. For the high-voltage battery 21, the functions of charging and discharging are controlled by the battery ECU 10. In the high-voltage battery 21, a main contactor 212p and contactor 211n are connected in this order in series, and by these turning ON, a capacitor which is not illustrated is formed between the positive terminal and negative terminal. A pre-charge contactor 211p and pre-charge resistor 211r are connected in parallel to the main contactor 212p. A pre-charge contactor 211p and pre-charge resistor 211r are connected in series, and the current through the pre-charge contactor 211p is eased by the pre-charge resistor 211r. When the contactors 42, 45 are turned ON, charging is carried out based on the voltage applied from the DC charging unit 4 to a capacitor which is not illustrated. On the other hand, by the contactor 42 being turned OFF, and the pre-charge contactor 211p and contactor 211n turning ON, the electric charge stored in the high-voltage battery 21 discharges, and current is supplied to the first inverter 23 or high-voltage DCDC converter 22 (hereinafter this is called "pre-charge"). Then, also in the case of the pre-charge contactor 211p being turned OFF, and the main contactor 212p and contactor 211n turning ON, current is supplied to the first inverter 23 or high-voltage DCDC converter 22.

The low-voltage circuit 3 includes: the first electric power lines 26p, 26n connecting the high-voltage side positive terminal 221 and high-voltage side negative terminal 222 of the high-voltage DCDC converter 22 with the DC I/O side of the second inverter 24; the primary side voltage sensor 28 which detects the voltage of the first electric power lines 26p, 26n; the primary side current sensor 30 capable of detecting the current to the capacitor C1; the accessory 6; and the AC charging unit 5.

The second inverter 24 is a similar configuration as the first inverter 23, and includes a function of switching between DC power and AC power. The second inverter 24 is connected to the terminal 241 of the first electric power line 26p and terminal 242 of the first electric power line 26n on the DC I/O side thereof, and is connected to each coil of the U phase, V phase and W phase of the drive motor RM on the AC I/O side. The capacitor C6 is provided between the terminal 241 and terminal 242. The active discharge controller 244 which controls the discharge during collision of the vehicle V, and the capacitors C7, C8 are provided in parallel on the high-voltage DCDC converter 22 to the capacitor C6. A grounded terminal 243 is provided between the terminal 245 of the first electric power line 26p and the terminal 246 of the first electric power line 26n, the capacitor C7 is provided between the terminal 245 and terminal 243, and the capacitor C8 is provided between the terminal 243 and terminal 246.

The second inverter 24, by ON/OFF driving the switching element of each phase in accordance with gate drive signals generated at a predetermined timing by the motor ECU 11, converts the DC power supplied from the high-voltage DCDC converter 22 into AC power and supplies to the drive motor FM, and converts the AC power supplied from the drive motor FM into DC power and supplies to the high-voltage DCDC converter 22.

The AC charging unit 5 includes an AC charger 53 having a function of converting AC current into DC current, and the output current thereof is supplied to a primary side. The input/output of current to the AC charger 53 is controlled by a charge ECU 54. The AC charging unit 5 and the terminal on the positive side of the AC charger 53 are connected to a fifth electric power line 51p, and the AC charging unit 5 and terminal on the negative side of the AC charger 53 are connected to a fifth electric power line 51n. The fifth electric power line 51p is connected to the terminal 304 and the terminal 301 of the first electric power line 26p via terminal 302. The fifth electric power line 51n is connected to the terminal 303 of the first electric power line 26n via the terminal 228.

The accessory 6 includes an electric compressor, heater, etc., for example. The terminal on the positive side of the smoothing capacitor C9 provided to the accessory 6 is connected to the fourth electric power line 61p, and the terminal on the negative side of the capacitor C9 is connected to the fourth electric power line 61n. The fourth electric power line 61p is connected to the terminal 301 of the first electric power line 26p via the fuse 61 and terminal 302, and the fourth electric power line 61n is connected to the terminal 303 of the first electric power line 26n via the terminal 228. In other words, the accessory 6 is connected in parallel between the high-voltage DCDC converter 22 and second inverter 24.

Therefore, the DC charging unit 4 is connected to the high-voltage source, performs charging to the high-voltage battery 21, and can supply electric power by applying voltage between the first electric power lines 26p, 26n. In other words, in the high-voltage charging path formed by the contactors 42, 45 turning ON, high voltage is applied between the terminals 211, 229. In the low-voltage charging path formed by the contactors 43, 45 being turned ON, low voltage which was stepped down by the DCDC converter 22 is applied between the terminals 229, 301.

Figure 2:
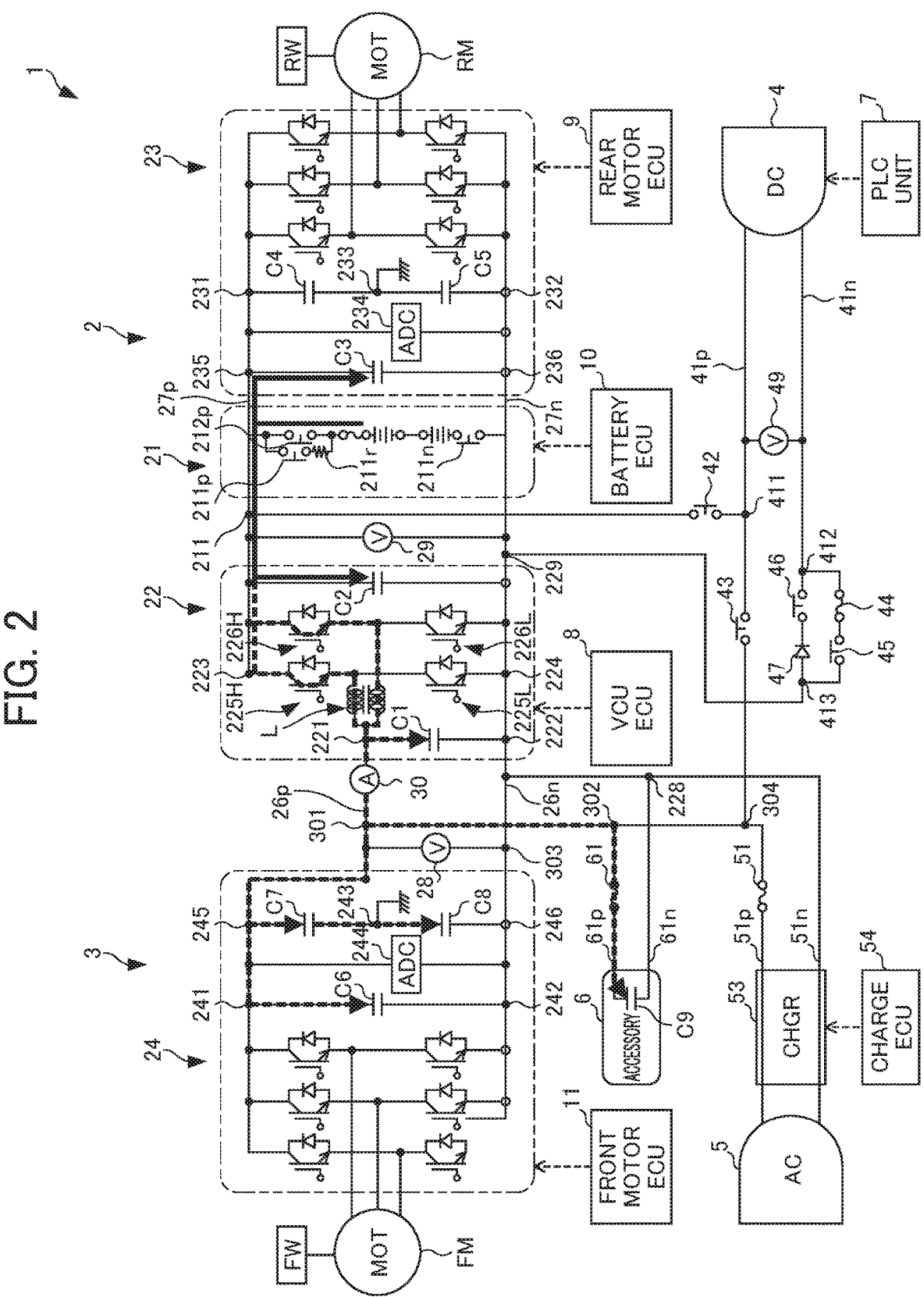
FIG. 2 is a view showing the flow of electric current of pre-charge according to the first embodiment.

Operation of pre-charge according to the first embodiment will be explained by referencing FIGS. 2 and 3. In the first embodiment, when the main contactor 212p, which is a switching means for switching between the connected state and isolated state of the high-voltage battery 21, switches from the isolated state to the connected state, the VCUECU 8 controls the high-voltage DCDC converter 22 based on the acquired value of the current sensor 30 as shown by the arrow S in FIG. 2.

Figure 3:
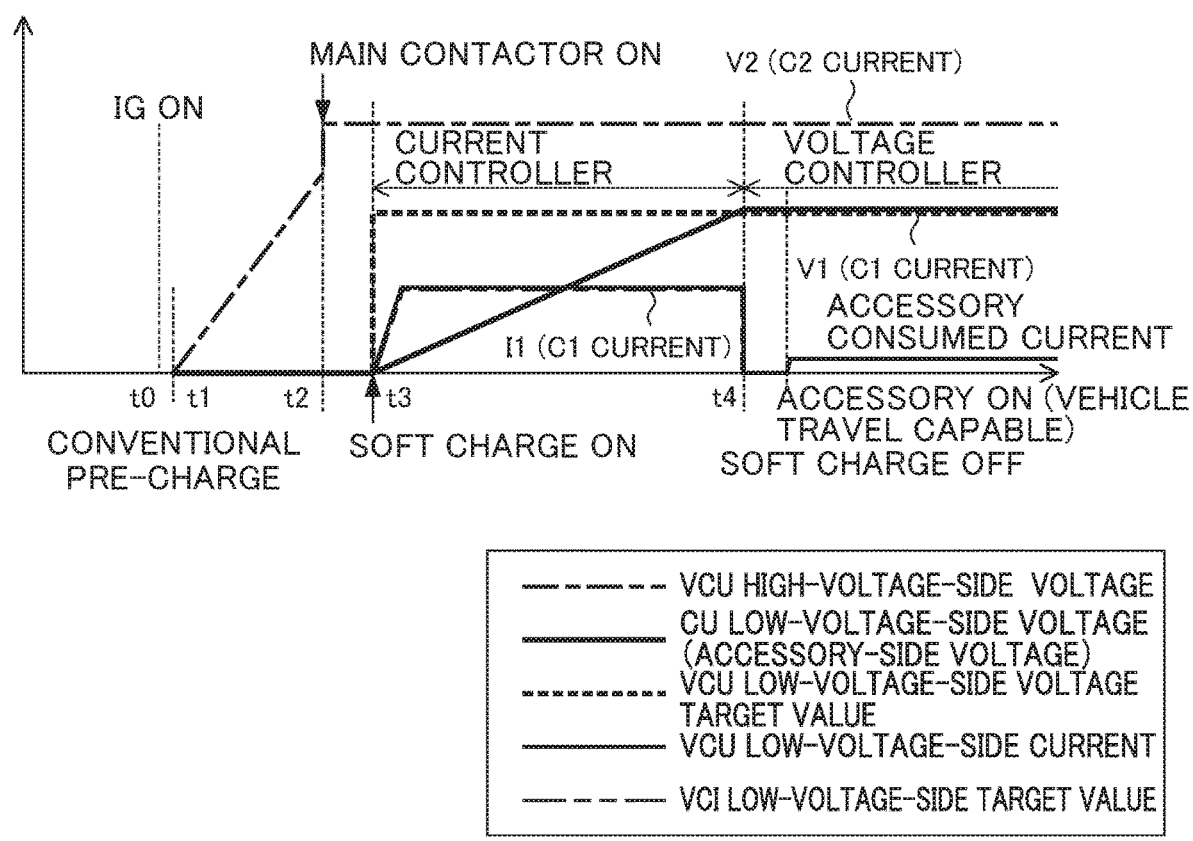
FIG. 3 is a view showing a timing chart of pre-charge according to the first embodiment.

FIG. 3 is a timing chart of pre-charge according to the first embodiment. At time t0, when ignition turns ON, the VCUECU 8 starts control of electric power. At time t1, pre-charge starts. When the VCUECU 8 sets the contactor 211p to the ON state, current flows to the capacitors C2, C3 in the path shown by arrow A, and the voltage value V2 gradually rises from time t1. At time t2, the VCUECU 8 sets the main contactor 212p to the ON state. At time t3, when setting the switches of the high-arm elements 225H, 226H to the ON state, the electric charge flows to the capacitors C1, C6, C7, C8 and C9 in the path shown by arrow B in FIG. 3. When the VCUECU 8 controls so as to keep constant the current I1 flowing into the capacitor C1 based on the acquired value of the current sensor 30, the voltage value V1 of the capacitor C1 gradually rises. When the capacitor C1 enters the full charge state at time t4, the voltage value V1 reaches a constant value, and the value of current I1 becomes almost 0. The value of charging current I1 may be a predetermined value decided in advance, and it may be set so that the value becomes smaller as the environment temperature, for example, ambient temperature or fuse temperature, becomes higher.

In this way, according to the power supply system for the vehicle according to the first embodiment, by controlling the high-voltage DCDC converter 22 so that the charging current value to the capacitor C1 of the current sensor 30 becomes constant, it is possible to appropriately perform charging of the contactor after system startup while suppressing blowing of the fuse. As a result, it is possible to quickly establish an electrical machine in a standby state.

Figure 4:
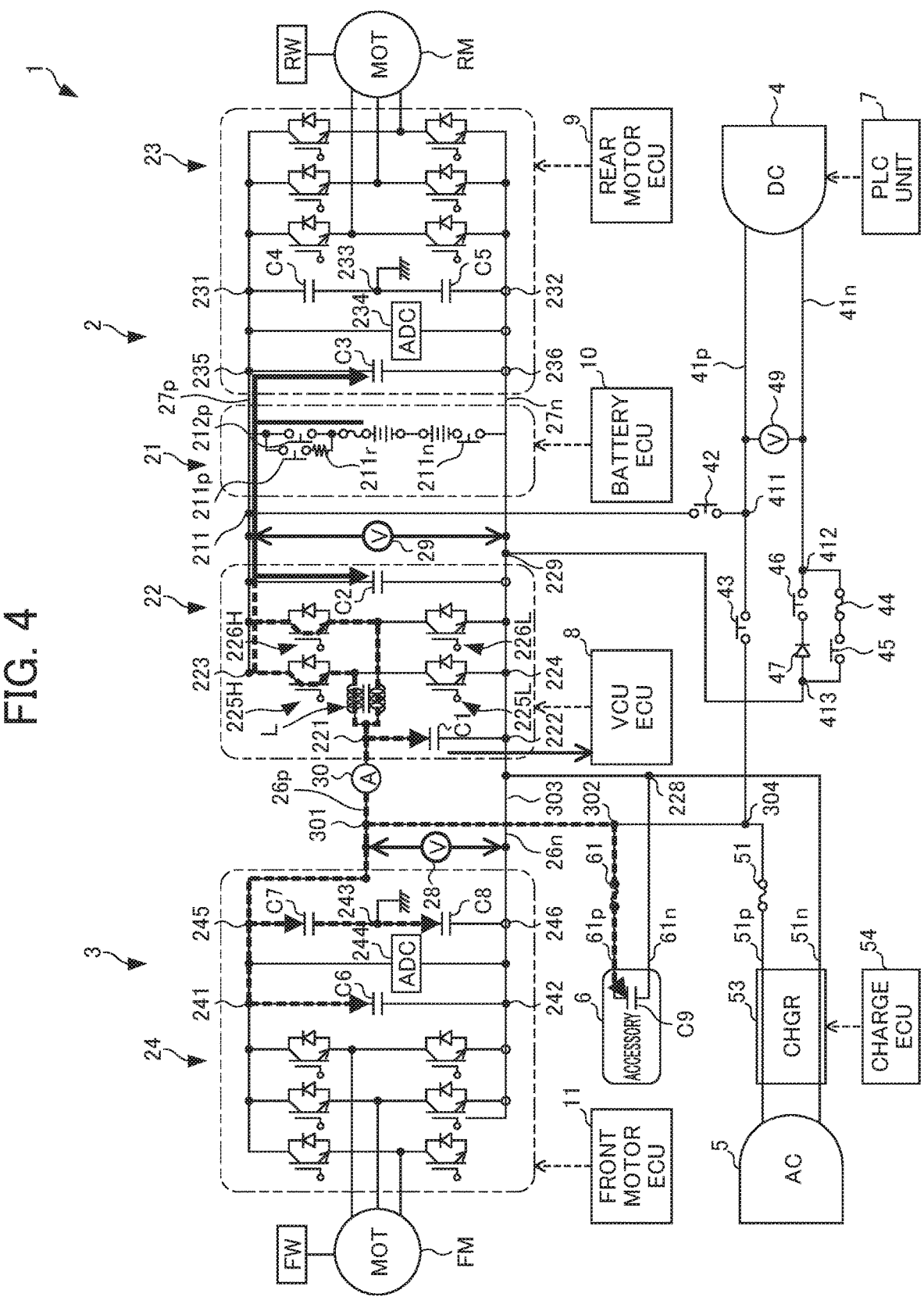
FIG. 4 is a view showing the flow of electric current of pre-charge according to a second embodiment.

Operation of pre-charge according to a second embodiment will be explained by referencing FIGS. 4 and 5. Since the circuit configuration of the power supply system 1 is identical to the first embodiment, explanation thereof will be omitted. The difference from the first embodiment is the control method of pre-charge by the VCUECU 8. In the second embodiment, when the contactor 211p, which is the switching means for switching between the connected state and isolated state of the high-voltage battery 21, switches from the isolated state to the connected state, the VCUECU 8 controls the high-voltage DCDC converter 22 so that the charging voltage value of the capacitor C1 rises step-wise, based on the acquired values of the voltage sensors 28, 29 as shown by arrow S in FIG. 4.

Figure 5:
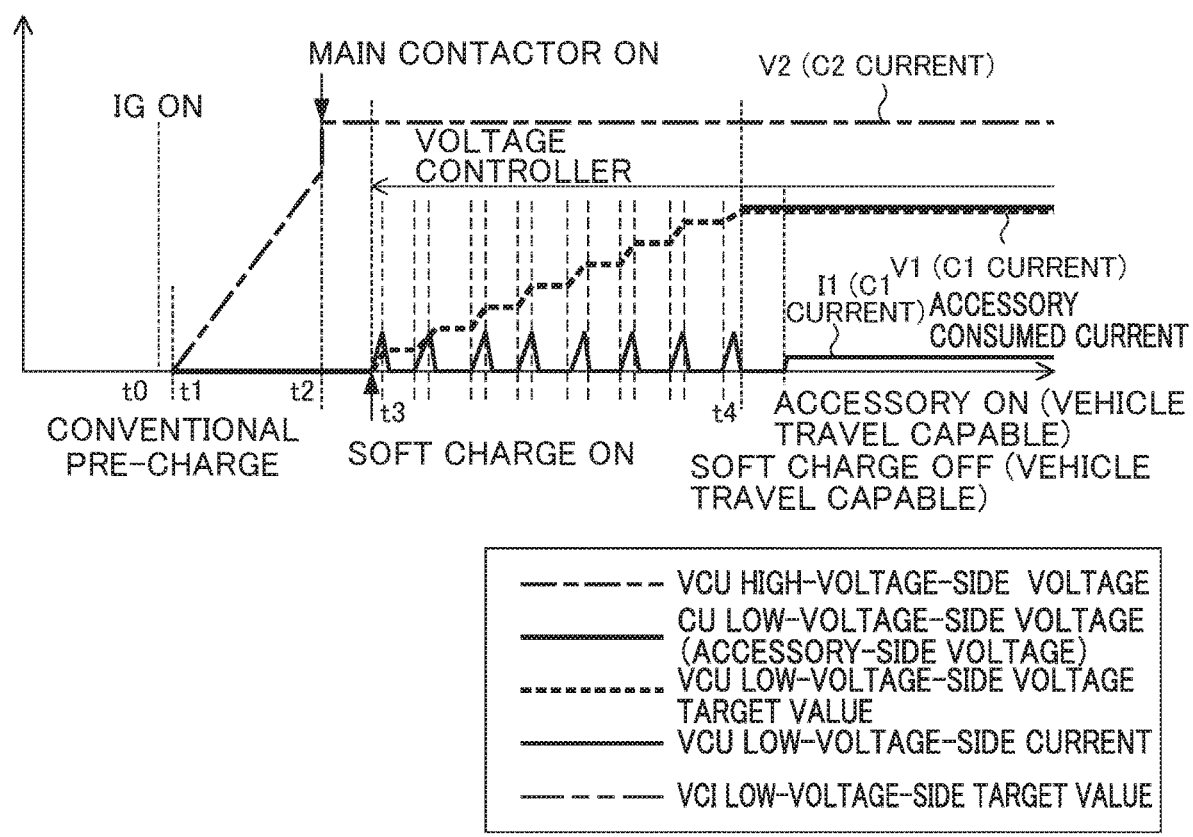
FIG. 5 is a view showing a timing chart of pre-charge according to the second embodiment.

FIG. 5 is a timing chart of pre-charge according to the second embodiment. At time t0, when the ignition turns ON, the VCUECU 8 starts control of electric power. At time t1, pre-charge starts. When the VCUECU 8 sets the contactor 211p to the ON state, current flows to the capacitors C2, C3 in the path shown by arrow A, and the voltage value V2 gradually rises from time t1. At time t2, the VCUECU 8 sets the main contactor 212p to the ON state. At time t3, when setting the switches of the high-arm terminals 225H, 226H to the ON state, the electric charge flows to the capacitors C1, C6, C7, C8 and C9 in the path shown by arrow B in FIG. 4. The VCUECU 8 controls the current I1 flowing to the capacitor C1, so that the capacitor C1 rises step-wise based on the acquired value of the voltage sensors 28, 29. When the voltage value V1 of the capacitor C1 rises step-wise, and the capacitor C1 reaches the fully charged state at time t4, the voltage value V1 reaches a constant value, and the value of the current I1 also becomes almost 0.

In this way, according to the power supply system for the vehicle according to the second embodiment, by current flowing slowly to the capacitor C1, since it is possible to prevent damage of elements and suppress blowing of the fuse, it is possible to perform charging appropriately until the desired charging voltage.

Figure 6:
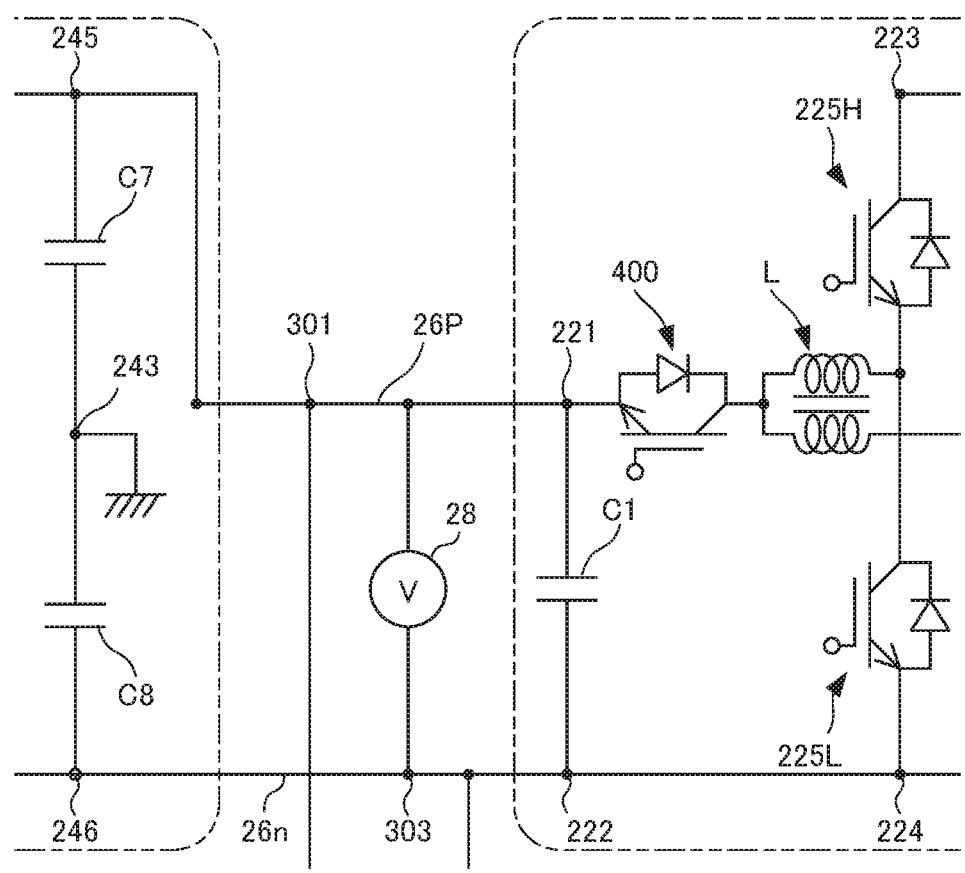
FIG. 6 is a view showing part of a power supply system for a vehicle according to a third embodiment.

FIG. 6 is a view showing part of a power supply system for a vehicle according to a third embodiment. In the circuit configuration of the third embodiment, a switching element 400 is added to the circuit configuration of the first embodiment. The switching element 400 is arranged between the reactor L of the high-voltage DCDC converter 22 which steps down the voltage of the high-voltage battery 21, and the second inverter 24, accessory 6 and AC charging unit 5 which connect to the high-voltage DCDC converter 22. As shown in FIG. 6, in the direction in which the collector is connected to the terminal 221 between the reactor L and terminal 221, the switching element 400 such as IGBT is connected.

The switching element 400 may be controlled by the VCUECU 8, as a part of the DCDC converter 22. In this case, by the VCUECU 8 turning ON/OFF the switching element 400, it is possible to slowly charge the capacitor C1 by easing the current from the high-voltage battery 21. The switching element 400, upon the element of the top-side arm of the high-voltage DCDC converter 22 short-circuit failing, for example, can suppress the high voltage from being applied to the primary side to which the front motor ECU 11, accessory, etc. are connected. In this way, according to the power supply system for the vehicle according to the third embodiment, it becomes possible to prevent failure of the power supply system 1.

It should be noted that the equipment called accessory in the aforementioned first to third embodiments may be the DC charging unit 4 capable of charging by DC charging source; voltage sensor 49 which acquires the voltage value applied to the DC charging unit 4 by an external charging device; a high-voltage charging path which connects from the DC charging unit 4 to between the high-voltage DCDC converter 22 and high-voltage battery 21; and low-voltage charging path which connects from the DC charging unit 4 to between the high-voltage DCDC converter 22 and second inverter 24. The VCUECU 8 may control the high-voltage DCDC converter 22 based on the acquired value by the voltage sensor 49, prior to charging start from the low-voltage charging path, and regulate the voltage of the capacitor C1. Upon charging the vehicle from an external charging device, since it is possible to appropriately charge to the capacitor C1 on the step-down side, system failure can be suppressed.

According to the power supply system 1 according to the above such first to third embodiments, it is possible to avoid unnecessary cost increases such as for handling higher voltage of accessories 6, and possible to suppress failure of the accessories 6.

It should be noted that the present invention is not to be limited to the above-mentioned embodiments, and that modifications, improvements, etc. within a scope capable of achieving the object of the present invention shall also be encompassed by the present invention.

EXPLANATION OF REFERENCE NUMERALS 1 power supply system
21 high-voltage battery
23 first inverter
RM drive motor
22 high-voltage DCDC converter
24 second inverter
C1 accessory 6 capacitor
30 current sensor
28 voltage sensor
8 VCUECU

What is claimed is:

1. A power supply system for a vehicle comprising:
a storage battery;
a first power converter which connects with the storage battery;
a first drive motor which connects with the first power converter;
a voltage converter which steps down voltage of the storage battery;
an electrical machine which connects with the voltage converter;
a capacitor which connects in parallel with the electrical machine;
a charging state acquisition means for acquiring a charging state of the capacitor; and
a control means for controlling the voltage converter based on an acquired value of the charging state acquisition means,
wherein the charging state acquisition means is a voltage value acquisition means, and controls the voltage converter so that the charging voltage value of the capacitor rises step-wise.

2. The power supply system for a vehicle according to claim 1, further comprising a switching means for switching between a connected state and isolated state of the storage battery,
wherein the control means controls the voltage converter based on the acquired value of the charging state acquisition means when the switching means switched from the isolated state to the connected state.

3. The power supply system for a vehicle according to claim 1, wherein the charging state acquisition means is a current value acquisition means, and controls the voltage converter so that a charging current value to the capacitor becomes constant.

4. The power supply system for a vehicle according to claim 1, wherein the electrical machine is a secondary drive motor which connects via a second power converter.

5. The power supply system for a vehicle according to claim 1, wherein the electrical machine is an accessory.

6. The power supply system for a vehicle according to claim 1, further comprising a switching element disposed between a coil of a voltage converter which steps down the voltage of the storage battery, and an electrical machine which connects with the voltage converter.

7. A power supply system for a vehicle according to claim 6 comprising:
a storage battery;

a first power converter which connects with the storage battery;

a first drive motor which connects with the first power converter;

a voltage converter which steps down voltage of the storage battery;

an electrical machine which connects with the voltage converter;

a capacitor which connects in parallel with the electrical machine;

a charging state acquisition means for acquiring a charging state of the capacitor; and a control means for controlling the voltage converter based on an acquired value of the charging state acquisition means, wherein the electrical machine is an accessory, wherein the accessory is:
- a DC charging unit capable of charging by the DC charging source;
- an applied voltage value acquisition means for acquiring a voltage value applied to the DC charging unit by an external charging device;
- a high-voltage charging path which connects from the DC charging unit to between the voltage converter and the storage battery; and
- a low-voltage charging path which connects from a DC charging unit between a voltage converter and the second power converter, and wherein the control means controls the voltage converter based on an applied voltage acquired value prior to charging start from the low-voltage charging path, and regulates voltage of a capacitor.

8. The power supply system for a vehicle according to claim 7, further comprising a switching means for switching between a connected state and isolated state of the storage battery, wherein the control means controls the voltage converter based on the acquired value of the charging state acquisition means when the switching means switched from the isolated state to the connected state.

9. The power supply system for a vehicle according to claim 7, wherein the charging state acquisition means is a current value acquisition means, and controls the voltage converter so that a charging current value to the capacitor becomes constant.

10. The power supply system for a vehicle according to claim 7, wherein the electrical machine is a secondary drive motor which connects via a second power converter.

11. The power supply system for a vehicle according to claim 7, further comprising a switching element disposed between a coil of a voltage converter which steps down the voltage of the storage battery, and an electrical machine which connects with the voltage converter.

* * * * *